United States Patent
Chen et al.

(10) Patent No.: US 6,242,763 B1
(45) Date of Patent: Jun. 5, 2001

(54) LOW TRIGGERING VOLTAGE SOI SILICON-CONTROL-RECTIFIER (SCR) STRUCTURE

(75) Inventors: Shiao-Shien Chen, Chung-Li; Tien-Hao Tang, Chung-Ho; Jih-Wen Chou; Mu-Chun Wang, both of Hsin Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/396,163

(22) Filed: Sep. 14, 1999

(51) Int. Cl.[7] .......................... H01L 29/24; H01L 31/111
(52) U.S. Cl. .................... 257/107; 257/119; 257/162; 257/146; 257/173
(58) Field of Search ................................ 257/107, 119, 257/162, 146, 173

(56) References Cited

U.S. PATENT DOCUMENTS 5,477,065 * 12/1995 Nakagawa et al. ................. 257/146
6,147,369 * 11/2000 Chen et al. .......................... 257/173

* cited by examiner

Primary Examiner—Nathan Flynn
Assistant Examiner—Brian D. MacDonald

(57) ABSTRACT

A low triggering voltage PD-SOI (Partially-Depleted Silicon-on-Insulator) electrostatic discharge (ESD) protection structure is disclosed. In one embodiment, the protection structure includes: A semiconductor substrate; a thin film layer separated from a bulk silicon substrate by an insulator inside the semiconductor substrate; a first isolation region formed in the thin film layer; a second isolation region formed in the thin film layer; a first region having a first conductivity type formed in between the first and second isolation region; a second region formed in between the first region and the second isolation region, the second region being of a second conductivity type; a third region formed in between the first isolation region and the first region, the third region being of the first conductivity type; a fourth region formed in between the second isolation region and the second region, the fourth region being of the first conductivity type; a fifth region having an exposed upper surface formed in the first region, the fifth region being of the second conductivity type; a sixth region having an exposed surface formed in the second region, the sixth region being of the second conductivity type; and a seventh region having an exposed upper surface formed in the second region and overlapping the first region, moreover, the seventh region being between the fifth and sixth region and the seventh region being of the first conductivity type. Another embodiment of the present invention is very similar to the previous one, which is also extracted in the present specification.

26 Claims, 2 Drawing Sheets

LOW TRIGGERING VOLTAGE SOI SILICON-CONTROL-RECTIFIER (SCR) STRUCTURE

BACKGROUND OF THE INVENTION

1. Field of the Invention

The present invention relates to an apparatus for electrostatic discharge (ESD) protection in silicon-on-insulator (SOI) technologies and, more particularly, to a low triggering voltage partially-depleted (PD) SOI silicon-control-rectifier (SCR) structure.

2. Description of the Prior Art

Metal oxide semiconductor field effect transistor (MOSFET) scaling on bulk silicon has been the primary focus of the semiconductor and microelectronic industry for achieving complementary metal oxide semiconductor (CMOS) chip performance and density objectives. The shrinking of MOSFET dimensions for high density, low power and enhanced performance requires reduced power-supply voltages. Because power consumption (P) is a function of capacitance (C), power supply voltage (V), and transition frequency (f), in accordance with the expression $P=CV^2f$, the focus has been on reducing both C and V as the transition frequency f increases. As a result, dielectric thickness and channel length are scaled with power-supply voltage. Power-supply reduction continues to be the trend for future low-voltage CMOS. However, with power supply reduction, transistor performance is severely impacted by both junction capacitance and the MOSFET body effect at lower voltages. As technologies scale below 0.25 $\mu$m channel lengths, to 0.15 and 0.1 $\mu$m, short-channel effects (SCE) control, gate resistance, channel profiling and other barriers become an issue for advanced CMOS technologies. While significant success has been achieved with successive scaling of bulk CMOS technology, the manufacturing control issues and power consumption will become more difficult with which to deal.

Using silicon-on-insulator (SOI) substrates, many of the concerns and obstacles of bulk-silicon CMOS can be eliminated at low power supply voltages. CMOS-on-SOI has significant advantages over bulk CMOS technology and will achieve the scaling objectives of low power and high performance for future technologies. CMOS-on-SOI provides low power consumption, low leakage current, low capacitance diode structures, good sub-threshold I–V characteristics (better than 60 mV/decade), a low soft error rate from both alpha particles and cosmic rays, good static random access memory (SRAM) access times, and other technology benefits. SOI process techniques include epitaxial lateral overgrowth (ELO), lateral solid-phase epitaxy (LSPE) and full isolation by porous oxidized silicon (FIPOS) as are known in the art.

SOI has not become a mainstream CMOS technology in view of the rapid improvement in bulk CMOS technology performance. However, SOI is a contender for mainstream CMOS applications. One of the barriers to implementing SOI as a mainstream CMOS technology is the "floating body" issue. Another barrier is electrostatic discharge protection (ESD). With respect to ESD protection, one problem with SOI is that there are no diodes natural to the process that are not in the presence of a polysilicon gate edge. The primary reason this is a concern is that electrical overload of the polysilicon gate structure occurs as well as the high capacitance per unit length in the SOI MOSFET structure.

An ESD protection circuit that includes a silicon-control-rectifier (SCR) is considered to have very good electrostatic discharge performance. Since the SCR ESD protection circuit has a low snap-back holding voltage of about 1–5 volts and a low effective resistance of about 1–3 Ohms, it provides a very good discharge condition for the electrostatic current. Referring to FIG. 1A, an SCR is placed in between an Input/Output pad 10 and an internal circuit 11 to be protected. The internal circuit 11 is tied to the Input/Output pad 10 via a conducting line 12. An SCR device serves as the main component in a protection circuit. In the drawing, the SCR device consists essentially of a pnp bipolar junction transistor $T_1$ and an npn bipolar junction transistor $T_2$. The collector of the pnp transistor $T_1$ is connected together with the base of the npn transistor $T_2$, forming a cathode gate identified by the node 13. The cathode gate 13 is coupled to the emitter of the npn transistor $T_2$, via a spreading resistor $R_p$, constituting a cathode 14 which is connected to a Vss terminal of the CMOS-on-SOI device. The base of the pnp transistor $T_1$ is connected together with the collector of npn transistor $T_2$ to form an anode gate identified by the node 15. The anode gate 15 is coupled to the emitter of the pnp transistor $T_1$, via a spreading resistor $R_n$, constituting an anode 16 which is connected to the conducting line 12.

A conventional PD-SOI (Partially-Depleted Silicon-on-Insulator) SCR cross-sectional view is shown in FIG. 1B, wherein there is an SOI substrate 20 including a thin film layer 21 separated from a bulk silicon substrate 22 by a buried oxide insulator 23. On top of the buried oxide insulator 23 two shallow trench isolation regions 24A and 24B are formed. Moreover, there are four conductivity regions in between those two shallow trench isolation regions and inside the thin film layer 21. These conductivity regions are P+ conductivity region 25, N conductivity region 26, P conductivity region 27, and N conductivity region 28, which form the conventional $P_+$-N-P-$N_+$ structure of the PD-SOI SCR device.

However, there is one inherent constraining design factor for the PD-SOI SCR used in ESD protection circuits for sub-micron semiconductor devices. The triggering voltage for SCRs in PD-SOI devices is in the range of 30 to 50 volts. The typical thickness of gate oxide layers in CMOS fabrication processes employing a resolution of 0.6–0.8 microns is about 150–200 angstroms. Considering a dielectric breakdown strength of 10 MV/cm for typical $SiO_2$ material, the gate oxide layers in these CMOS devices would be destroyed by a voltage of about 15–20 volts. Therefore, SCRs in PD-SOI devices with a trigger voltage in the range of 30–50 volts must be fitted with other protection components so that they can provide protection for gate oxide layers in CMOS on PD-SOI devices.

It is therefore an object of the present invention to provide an enhanced PD-SOI ESD protection performance apparatus for protecting internal circuits and particularly CMOS devices by reducing the trigger voltage required to turn on a protective PD-SOI SCR.

SUMMARY OF THE INVENTION

An object of the present invention is to substantially obviate one or more of the problems caused by limitations and disadvantages of the related art.

Another object of the present invention is to provide a partially depleted silicon-on-insulator (PD-SOI) electrostatic discharge protection device that protects an internal circuit from the static electricity.

A further object of the present invention is to provide a low triggering voltage PD-SOI silicon-control-rectifier (SCR) structure by using the zener diode breakdown characteristic, which is suitable in applying the design of PD-SOI ESD protection circuits.

In accordance with the present invention, a low triggering voltage PD-SOI (Partially-Depleted Silicon-on-Insulator) electrostatic discharge (ESD) protection structure is provided. In one embodiment, the protection structure includes: A semiconductor substrate; a thin film layer separated from a bulk silicon substrate by an insulator inside the semiconductor substrate; a first isolation region formed in the thin film layer; a second isolation region formed in the thin film layer; a first region having a first conductivity type formed in between the first and second isolation region but not adjoining to any of them; a second region formed in between the first region and the second isolation region but only adjoining to the first region, the second region being of a second conductivity type which is different from the first conductivity type; a third region formed in between the first isolation region and the first region, the third region being of the first conductivity type; a fourth region formed in between the second isolation region and the second region, the fourth region being of the first conductivity type; a fifth region having an exposed upper surface formed in the first region, the fifth region being of the second conductivity type; a sixth region having an exposed surface formed in the second region, the sixth region being of the second conductivity type; and a seventh region having an exposed upper surface formed in the second region and overlapping the first region, moreover, the seventh region being between the fifth and sixth region and the seventh region being of the first conductivity type.

In another embodiment of the present invention, the protection structure includes: A semiconductor substrate; a thin film layer separated from a bulk silicon substrate by an insulator inside the semiconductor substrate; a first isolation region formed in the thin film layer; a second isolation region formed in the thin film layer; a first region having a first conductivity type formed in between the first and second isolation region but not adjoining any of them; a second region formed in between the first region and the second isolation region but only adjoining to the first region, the second region being of a second conductivity type which is different from the first conductivity type; a third region formed in between the first isolation region and the first region, the third region being of the second conductivity type; a fourth region formed in between the second isolation region and the second region, the fourth region being of the second conductivity type; a fifth region having an exposed upper surface formed in the first region, the fifth region being of the first conductivity type; a sixth region having an exposed surface formed in the second region, the sixth region being of the first conductivity type; and a seventh region having an exposed upper surface formed in the first region and overlapping the second region, moreover, the seventh region being between the fifth and sixth region and the seventh region being of the second conductivity type.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
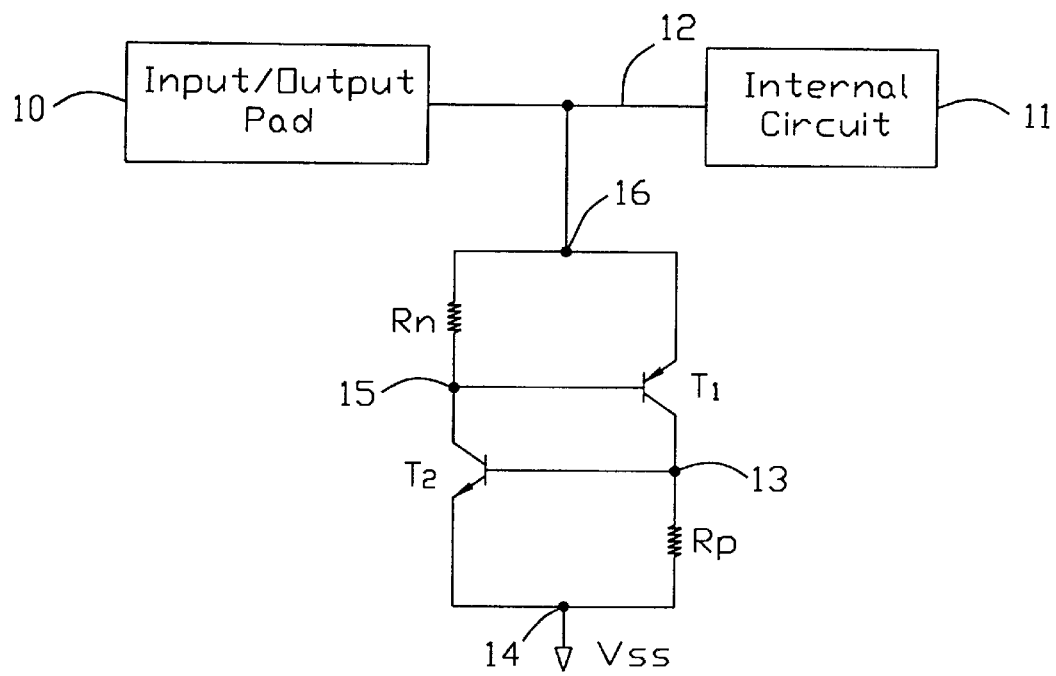
FIG. 1A is a conventional schematic diagram of a SCR device been placed in between an I/O pad and an internal circuit.
Figure 1B:
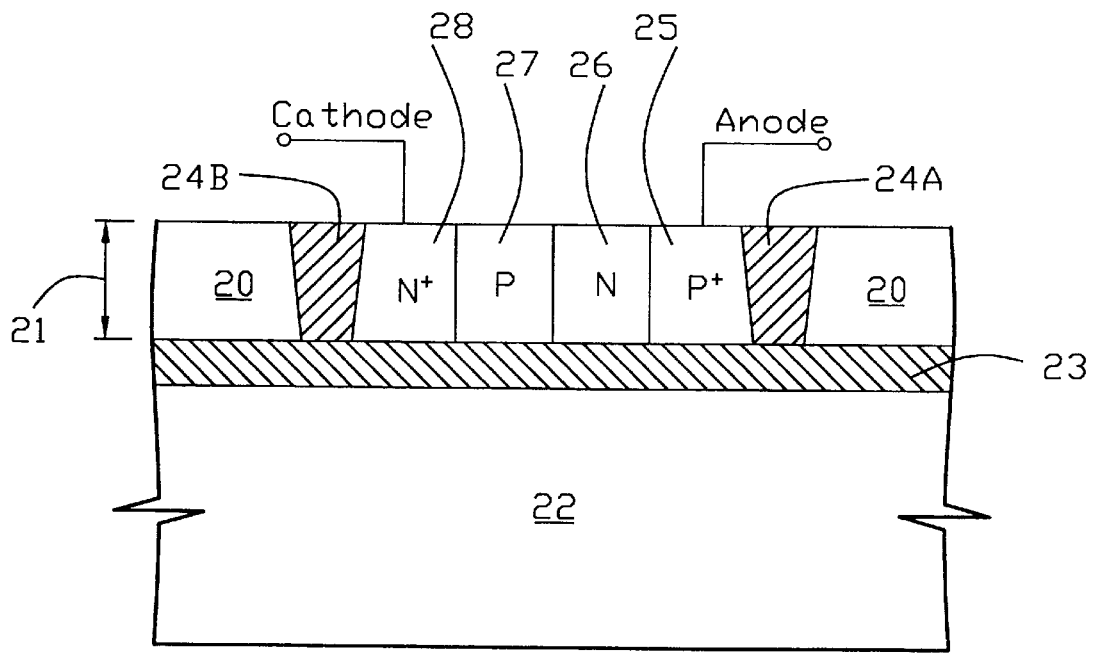
FIG. 1B is a diagrammatic illustration in section of a semiconductor device including a conventional PD-SOI SCR protection circuit
Figure 2:
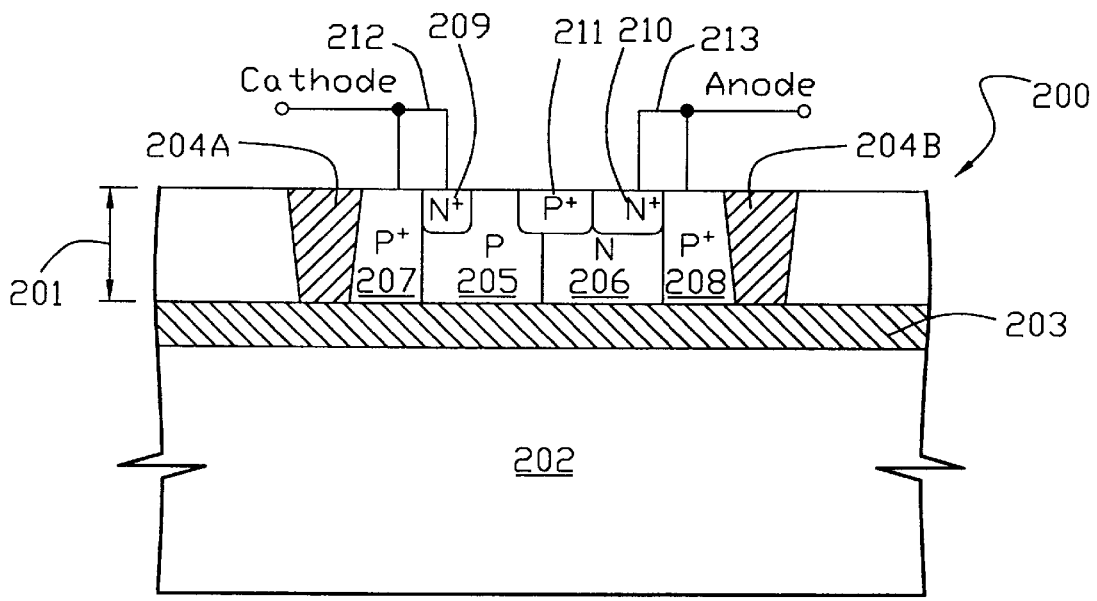
FIG. 2 is a cross-sectional view of one embodiment of the present invention.

Referring to FIG. 2, an arrangement for providing a low voltage trigger source for a protective PD-SOI (Partially-Depleted Silicon-on-Insulator) SCR (Silicon-Control-Rectifier) in accordance with an embodiment of the present invention is shown, wherein an improved low voltage trigger source is produced for the PD-SOI SCR by using a zener diode $N^+$-$P^+$ junction under a reverse bias. A semiconductor substrate 200 is firstly provided having a thin film layer 201 with a thickness of more than about 1000 angstroms separated from a bulk silicon substrate 202 by a buried oxide insulator 203 inside the semiconductor substrate 200. A first shallow trench isolation (STI) region 204A, preferably composed of silicon dioxide, is formed within the thin film layer 201 and at a certain distance away from the first STI region 204A where a second STI region 204B is formed. Both the first and second STI regions have a vertical depth equal to the thickness of the thin film layer 201, that is, they both connect to the buried oxide insulator 203, wherein the region surrounded by the STI regions 204A and 204B and the buried oxide insulator 203 is used for forming the low triggering voltage SCR device.

A first conductivity region 205 having a first conductivity type, preferably P-type conductivity, is formed in between the first and second STI regions 204A and 204B but not adjoining any of them. A second conductivity region 206 is formed in between the first conductivity region 205 and the second STI region 204B but only adjoining to the first conductivity region 205, moreover, the second conductivity region 206 is of a second conductivity type, preferably N-type conductivity, which is different to the first conductivity type. A first $P^+$ conductivity region 207 is formed in between the first STI region 204A and the first conductivity region 205. A second $P^+$ conductivity region 208 is formed in between the second STI region 204B and the second conductivity region 206.

Moreover, a first $N^+$ conductivity region 209 having an exposed upper surface is formed in the first conductivity region 205, as well as a second $N^+$ conductivity region 210 having an exposed surface formed in the second conductivity region 206. The first $N^+$ conductivity region 209 is coupled to its adjacent $P^+$ conductivity region 207 by a contact or bus 212, that is the cathode of the silicon-control-rectifier device. The second $N^+$ conductivity region 210 is coupled to its adjacent $P^+$ conductivity region 208 by another contact or bus 213, that is the anode of the silicon-control-rectifier device. In between the first $N^+$ conductivity region 209 and the second $N^+$ conductivity region 210 there is formed a third $P^+$ conductivity region 211 within the second conductivity region 206 having an exposed upper surface and overlapping the first conductivity region.

Furthermore, the second $N^+$ conductivity region 210 and the third $P^+$ conductivity region 211 form the $N^+$-$P^+$ junction of the zener diode. The breakdown voltage of the zener diode is controlled by adjusting the $P^+$ doping in the conductivity region 211, where the higher the doping the lower the breakdown voltage. Nevertheless, the leaking current is in direct proportion with the doping density, hence, a doping concentration in a range of about $1 \times 10^{18}$ to about $1 \times 10^{19}$ $cm^{-3}$ is preferred for achieving a triggering voltage ranging in between about 5 and 10 volts.

Figure 3:
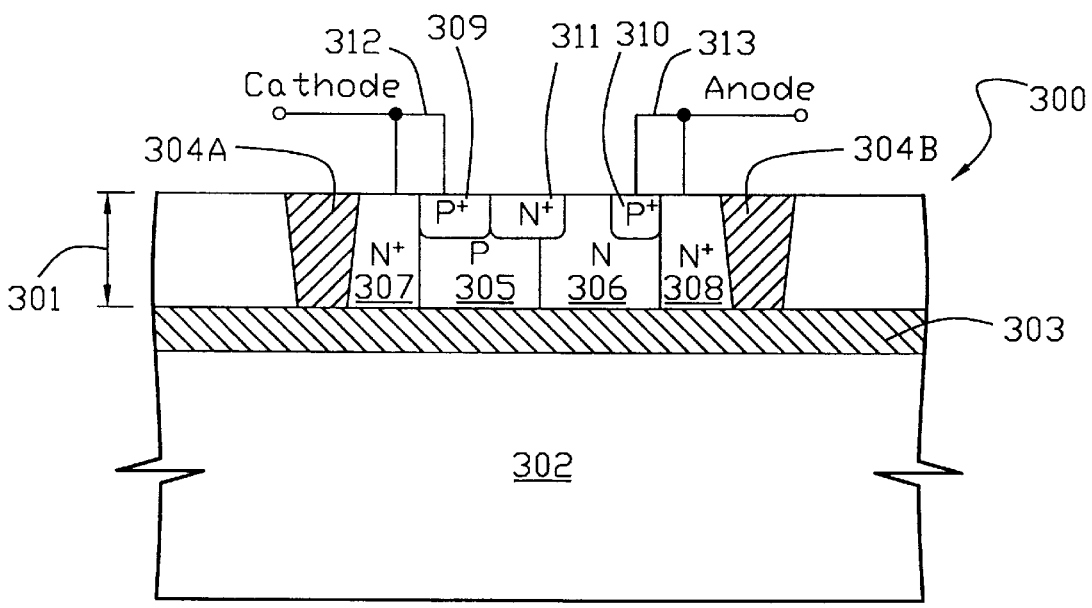
FIG. 3 is a cross-sectional view of another embodiment of the present invention.

FIG. 3 shows another embodiment of the present invention, which is very similar to the previous embodiment with different placement of the zener diode to lower the triggering voltage of the PD-SOI SCR device for ESD (Electrostatic Discharge) protection. A semiconductor substrate 300 is firstly provided having a thin film layer 301 separated from a bulk silicon substrate 302 by a buried oxide insulator 303 inside the semiconductor substrate 300. A first shallow trench isolation (STI) region 304A, preferably composed of silicon dioxide, is formed within the thin film layer 301 and at a certain distance away from the first STI region 304A where a second STI region 304B is formed. The region surrounded by the STI regions 304A and 304B and the buried oxide insulator 303 is used for forming the low triggering voltage SCR device.

A first conductivity region 305 having a first conductivity type, preferably P-type conductivity, is formed in between the first and second STI regions 304A and 304B but not adjoining any of them. A second conductivity region 306 is formed in between the first conductivity region 305 and the second STI region 304B but only adjoining the first conductivity region 305, moreover, the second conductivity region 306 is of a second conductivity type, preferably N-type conductivity, which is different the first conductivity type. A first $N^+$ conductivity region 307 is formed in between the first STI region 304A and the first conductivity region 305. A second $N^+$ conductivity region 308 is formed in between the second STI region 304B and the second conductivity region 306.

Moreover, a first $P^+$ conductivity region 309 having an exposed upper surface formed in the first conductivity region 305, as well as a second $P^+$ conductivity region 310 having an exposed surface formed in the second conductivity region 306. The first $P^+$ conductivity region 309 is coupled to its adjacent $N^+$ conductivity region 307 by a contact or bus 312, that is the cathode of the silicon-control-rectifier device. The second $P^+$ conductivity region 310 is coupled to its adjacent $N^+$ conductivity region 308 by another contact or bus 313, that is the anode of the silicon-control-rectifier device. In between the first $P^+$ conductivity region 309 and the second $P^+$ conductivity region 310 there is formed a third $N^+$ conductivity region 311 within the first conductivity region 305 having an exposed upper surface and overlapping the second conductivity region.

Furthermore, the first $P^+$ conductivity region 309 and the third $N^+$ conductivity region 311 form the $P^+$-$N^+$ junction of the zener diode. The breakdown voltage of the zener diode is controlled by adjusting the $N^+$ doping in the conductivity region 311, where the higher the doping the lower the breakdown voltage. Nevertheless, the leaking current is in direct proportion with the doping density, hence, a doping concentration in a range of about $1\times10^{18}$ to about $1\times10^{19} cm^{-3}$ is preferred for achieving a triggering voltage ranging in between about 5 and 10 volts.

In conclusion, an enhanced PD-SOI ESD protection performance apparatus for protecting internal circuits and particularly CMOS devices by reducing the trigger voltage required to turn on a protective PD-SOI SCR is disclosed by the present invention. The apparatus includes the PD-SOI SCR device as well as the $N^+$-$P^+$ junction of the zener diode.

Although specific embodiments have been illustrated and described, it will be obvious to those skilled in the art that various modifications may be made without departing from what is intended to be limited solely by the appended claims.

What is claimed is:

1. A low triggering voltage PD-SOI (Partially-Depleted Silicon-on-Insulator) electrostatic discharge (ESD) protection structure, said protection structure comprises:

a semiconductor substrate;

a thin film layer separated from a bulk silicon substrate by an insulator inside said semiconductor substrate;

a first isolation region formed in said thin film layer;

a second isolation region formed in said thin film layer;

a first region having a first conductivity type formed in between said first and second isolation region but not adjoining to any of them;

second region formed in between said first region and said second isolation region but only adjoining to said first region, said second region being of a second conductivity type which is different to said first conductivity type;

a third region formed in between said first isolation region and said first region, said third region being of said first conductivity type;

a fourth region formed in between said second isolation region and said second region, said fourth region being of said first conductivity type;

a fifth region having an exposed upper surface formed in said first region, said fifth region being of said second conductivity type;

a sixth region having an exposed surface formed in said second region, said sixth region being of said second conductivity type;

a seventh region having an exposed upper surface formed in said second region and overlapping said first region, moreover, said seventh region is in between said fifth and sixth region, said seventh region being of said first conductivity type;

a first contact on said structure coupled to said third region and said fifth region; and a second contact on said structure coupled to said fourth region and said sixth region.

2. The protection structure in accordance with claim 1, wherein said first conductivity type is p-type.

3. The protection structure in accordance with claim 1, wherein said second conductivity type is n-type.

4. The protection structure in accordance with claim 2, wherein said third region is p-type of a higher doping level than said first region.

5. The protection structure in accordance with claim 2, wherein said fourth region is p-type of a higher doping level than said first region.

6. The protection structure in accordance with claim 3, wherein said fifth region is n-type of a higher doping level than said second region.

7. The protection structure in accordance with claim 3, wherein said sixth region is n-type of a higher doping level than said second region.

8. The protection structure in accordance with claim 2, wherein said seventh region is p-type of a higher doping level than said first region, and having a doping concentration in a range of about $1\times10^{18}$ to about $1\times10^{19}$ $cm^{-3}$.

9. The protection structure in accordance with claim 1, wherein said first and second contact form the cathode and anode of a silicon-control-rectifier device respectively.

10. The protection structure in accordance with claim 1, wherein said sixth and seventh region form the $n^+$-$p^+$ junction of a zener diode.

11. The protection structure in accordance with claim 1, wherein said insulator comprises oxide.

12. The protection structure in accordance with claim 1, wherein said thin film layer has a thickness of more than about 1000 angstroms.

13. The protection structure in accordance with claim 1, wherein said first and second isolation region comprise silicon dioxide.

14. A low triggering voltage PD-SOI (Partially-Depleted Silicon-on-Insulator) electrostatic discharge (ESD) protection structure, said protection structure comprises:
  a semiconductor substrate;
  a thin film layer separated from a bulk silicon substrate by an insulator inside said semiconductor substrate;
  a first isolation region formed in said thin film layer;
  a second isolation region formed in said thin film layer;
  a first region having a first conductivity type formed in between said first and second isolation region but not adjoining to any of them;
  a second region formed in between said first region and said second isolation region but only adjoining to said first region, said second region being of a second conductivity type which is different to said first conductivity type;
  a third region formed in between said first isolation region and said first region, said third region being of said second conductivity type;
  a fourth region formed in between said second isolation region and said second region, said fourth region being of said second conductivity type;
  a fifth region having an exposed upper surface formed in said first region, said fifth region being of said first conductivity type;
  a sixth region having an exposed surface formed in said second region, said sixth region being of said first conductivity type;
  a seventh region having an exposed upper surface formed in said first region and overlapping said second region, moreover, said seventh region is in between said fifth and sixth region, said seventh region being of said second conductivity type;
  a first contact on said structure coupled to said third region and said fifth region; and
  a second contact on said structure coupled to said fourth region and said sixth region.

15. The protection structure in accordance with claim 14, wherein said first conductivity type is p-type.

16. The protection structure in accordance with claim 14, wherein said second conductivity type is n-type.

17. The protection structure in accordance with claim 16, wherein said third region is n-type of a higher doping level than said second region.

18. The protection structure in accordance with claim 16, wherein said fourth region is n-type of a higher doping level than said second region.

19. The protection structure in accordance with claim 15, wherein said fifth region is p-type of a higher doping level than said first region.

20. The protection structure in accordance with claim 15, wherein said sixth region is p-type of a higher doping level than said first region.

21. The protection structure in accordance with claim 16, wherein said seventh region is n-type of a higher doping level than said second region, and having a doping concentration in a range of about $1 \times 10^{18}$ to about $1 \times 10^{19}$ cm$^{-3}$.

22. The protection structure in accordance with claim 14, wherein said first and second contact form the cathode and anode of a silicon-control-rectifier device respectively.

23. The protection structure in accordance with claim 14, wherein said fifth and seventh region form the p$^+$-n$^+$ junction of a zener diode.

24. The protection structure in accordance with claim 14, wherein said insulator comprises oxide.

25. The protection structure in accordance with claim 14, wherein said thin film layer has a thickness of more than about 1000 angstroms.

26. The protection structure in accordance with claim 14, wherein said first and second isolation region comprise silicon dioxide.

* * * * *